(12) United States Patent
Ishida et al.

(10) Patent No.: US 11,462,887 B2
(45) Date of Patent: Oct. 4, 2022

(54) LASER ELEMENT

(71) Applicant: SHARP KABUSHIKI KAISHA, Osaka (JP)

(72) Inventors: Masaya Ishida, Sakai (JP); Takuya Nishida, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 227 days.

(21) Appl. No.: 16/828,811

(22) Filed: Mar. 24, 2020

(65) Prior Publication Data

US 2020/0313398 A1    Oct. 1, 2020

Related U.S. Application Data

(60) Provisional application No. 62/824,866, filed on Mar. 27, 2019.

(51) Int. Cl.
| | |
|---|---|
| H01S 5/40 | (2006.01) |
| H01S 5/02212 | (2021.01) |
| H01S 5/023 | (2021.01) |
| H01S 5/0233 | (2021.01) |
| H01S 5/0235 | (2021.01) |

(52) U.S. Cl.
CPC ............ H01S 5/4025 (2013.01); H01S 5/023 (2021.01); H01S 5/0233 (2021.01); H01S 5/0235 (2021.01)

(58) Field of Classification Search
CPC ...... H01S 5/4025; H01S 5/023; H01S 5/0233; H01S 5/0235; H01S 5/02212; H01S 5/4093; H01L 23/045
See application file for complete search history.

(56) References Cited

U.S. PATENT DOCUMENTS

| | | | |
|---|---|---|---|
| 2001/0026991 A1 | 10/2001 | Ichikawa et al. | |
| 2003/0165167 A1* | 9/2003 | Ichikawa ................ | H01L 24/85 372/36 |
| 2005/0232322 A1 | 10/2005 | Bessho et al. | |
| 2006/0251138 A1 | 11/2006 | Hata et al. | |
| 2007/0030872 A1 | 2/2007 | Sato et al. | |
| 2009/0161705 A1* | 6/2009 | Almoric ............... | H04N 9/3129 372/24 |
| 2009/0238230 A1 | 9/2009 | Bessho et al. | |
| 2012/0033702 A1 | 2/2012 | Bessho et al. | |

FOREIGN PATENT DOCUMENTS

| | | |
|---|---|---|
| JP | 2001267674 A | 9/2001 |
| JP | 2005317896 A | 11/2005 |
| JP | 2006041085 A | 2/2006 |
| JP | 2006269987 A | 10/2006 |
| JP | 4466503 B2 | 5/2010 |
| JP | 4701832 B2 | 6/2011 |
| JP | 2017147420 A | 8/2017 |
| JP | 2018195728 A | 12/2018 |

* cited by examiner

*Primary Examiner* — Xinning(Tom) Niu
(74) *Attorney, Agent, or Firm* — ScienBiziP, P.C.

(57) ABSTRACT

A laser element includes a light emitting portion that has at least two or more light emitting points, and a terminal member on which the light emitting portion is mounted. The terminal member includes a base portion that has a mounting surface on which the light emitting portion is mounted, a base that has a front surface where the base portion is provided substantially at a center, and four pins that extend from a rear surface of the base. The light emitting portion is positioned in a range surrounded by the four pins as viewed from the front surface of the base.

12 Claims, 9 Drawing Sheets

LASER ELEMENT

CROSS-REFERENCE TO RELATED APPLICATION

The present application claims priority from Provisional Patent Application 62/824,866, the content to which is hereby incorporated by reference into this application.

BACKGROUND OF THE INVENTION

1. Field of the Invention

The present disclosure relates to a laser element including a terminal member on which a light emitting portion is mounted.

2. Description of the Related Art

In recent years, displays using laser beams of R (red), G (green), and B (blue) as visible light have been actively developed. Laser elements that are mounted are different in a point considered as important depending on functions required for the displays. Specifically, for achieving increase in a size or definition of a display, a high-output laser element is needed. Moreover, for achieving size reduction of the display, size reduction of the laser element itself is required.

An example of the display required to be reduced in the size includes a projector of a projection type incorporated in glasses, in which a laser module needs to have a size within several centimeters square for size reduction. Moreover, as the laser element that is incorporated, a laser element that is 3.8 mm in a diameter (φ) is used because a typical laser element having a diameter (φ) of 5.6 mm is too large. Moreover, as the laser element used for the display, a laser element on which a plurality of light emitting elements (laser chips) are mounted to output a plurality of laser beams that have different wavelengths is known.

In a semiconductor laser element described in Japanese Patent No. 4701832, a first light emitting element and a second light emitting element are provided on a heat sink and a first insulating layer and a second insulating layer that are provided between the first light emitting element and the second light emitting element are layered.

In a laser diode described in Japanese Patent No. 4466503, a first light emitting element and a second light emitting element are disposed on a support base in an overlapping manner.

In the laser element described above, two light emitting elements are mounted on a heat block and electrodes provided in the light emitting elements and five connection terminals (pins) are electrically connected via wires. Sizes of the pins are roughly decided so as to allow connection to an external device (for example, wire substrate). When the number of pins is large, there is a problem that the size of the laser element itself needs to be increased in order for the pins to be arranged so as not to interfere with each other and is difficult to be 3.8 mm in a diameter (φ).

Meanwhile, a known display is assembled by using separate light emitting elements for laser beams of R, G, and B. Different light outputs are required for the respective colors, and a display that emits laser beams including two green laser beams, such as R, G, G, and B, is also actually developed. Here, a laser beam has a disadvantage that coherency is high and speckle noise is easily generated when a plurality of laser beams are radiated.

The disclosure is made in order to solve the aforementioned problems and aims to provide a laser element in which size reduction is achieved.

SUMMARY OF THE INVENTION (1) An embodiment of the invention is a laser element including: a light emitting portion that has at least two or more light emitting points; and a terminal member on which the light emitting portion is mounted, in which the terminal member includes a base portion that has a mounting surface on which the light emitting portion is mounted, a base that has a front surface where the base portion is provided substantially at a center, and four pins that extend from a rear surface of the base, and the light emitting portion is positioned in a range surrounded by the four pins as viewed from the front surface of the base.

(2) Moreover, an embodiment of the invention is the laser element in which the four pins are constituted by a front pin provided at a position facing the mounting surface, a rear pin provided so as to face the front pin at a position where the light emitting portion is interposed therebetween, and two side pins provided so as to face each other with the light emitting portion therebetween in a direction of a side surface along the mounting surface, as viewed from the front surface of the base, and a length by which the front pin protrudes from the front surface of the base is shorter than lengths of the other pins, in addition to the configuration of (1) described above.

(3) Moreover, an embodiment of the invention is the laser element in which the base portion includes eaves portions obtained by cutting ends in the direction of the side surface, and the side pins are provided at positions facing the eaves portions, in addition to the configuration of (2) described above.

(4) Moreover, an embodiment of the invention is the laser element in which the base is electrically connected to the rear pin and is insulated from the front pin and the side pins, in addition to the configuration of (2) or (3) described above.

(5) Moreover, an embodiment of the invention is the laser element in which the base has a circular shape as viewed from a side of the front surface, in addition to any one of the configurations (1) to (4) described above.

(6) Moreover, an embodiment of the invention is the laser element in which, the base has a D-cut shape in which one end is cut as viewed from a side of the front surface, in addition to any one of the configurations (1) to (4) described above.

(7) Moreover, an embodiment of the invention is the laser element in which, the base has an I-cut shape in which ends facing each other are cut as viewed from a side of the front surface, in addition to any one of the configurations (1) to (4) described above.

(8) Moreover, an embodiment of the invention is the laser element in which the light emitting portion includes at least two or more laser chips, in addition to any one of the configurations (1) to (7) described above.

(9) Moreover, an embodiment of the invention is the laser element in which the light emitting portion includes a laser chip having at least two or more light emitting points, in addition to any one of the configurations (1) to (7) described above.

(10) Moreover, an embodiment of the invention is the laser element in which the light emitting portion has two light emitting points that output laser beams whose wavelength difference is 0.5 nm or more and 5 nm or less, in addition to any one of the configurations (1) to (9) described above.

According to the disclosure, electrical connection via the four pins enables separate control of laser beams emitted from a plurality of light emitting points. Moreover, when the pins are appropriately arranged on the base with the number thereof limited, it is possible to achieve size reduction of the laser element.

DETAILED DESCRIPTION OF THE INVENTION

First Embodiment

A laser element according to a first embodiment of the invention will be described below with reference to the drawings.

Figure 1:
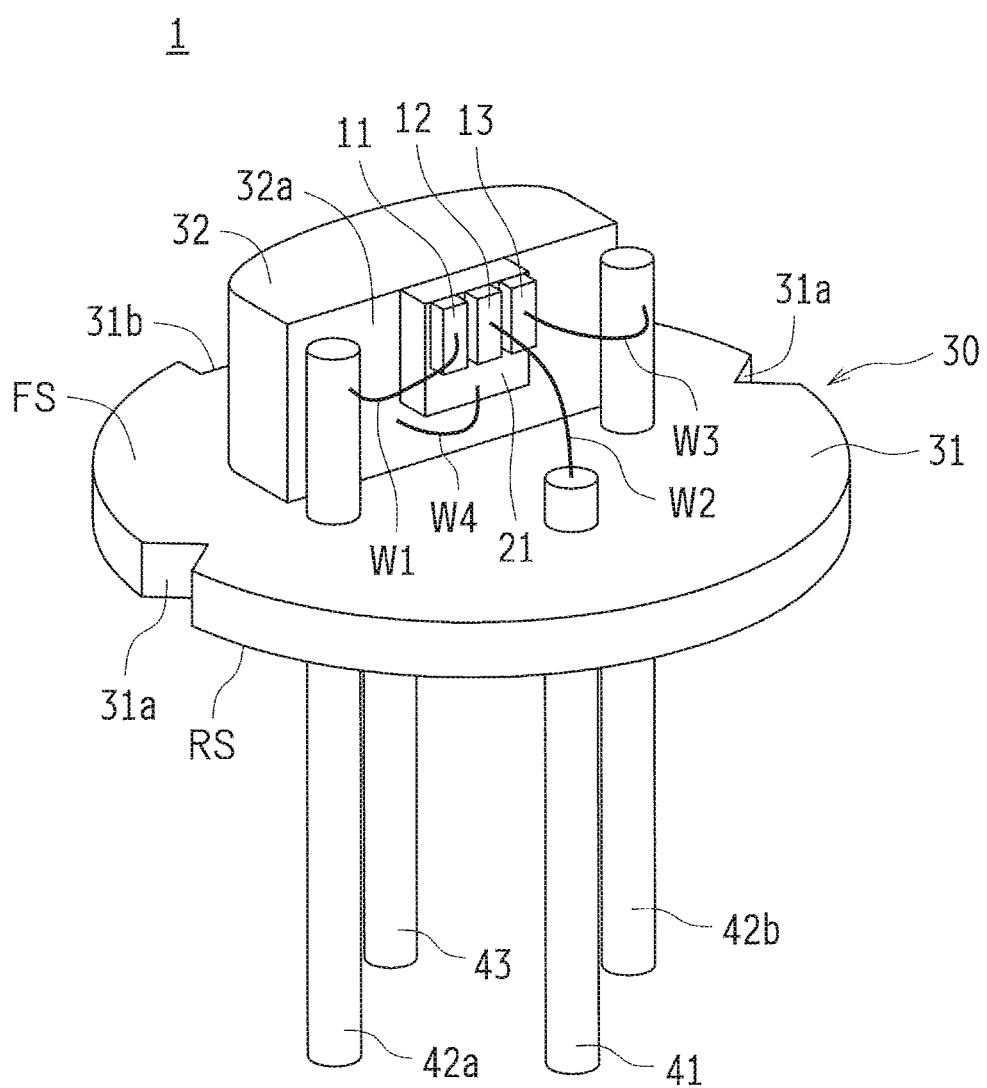
FIG. 1 is a schematic perspective view illustrating a state of a laser element according to a first embodiment of the invention before being sealed by a cap.
Figure 2:
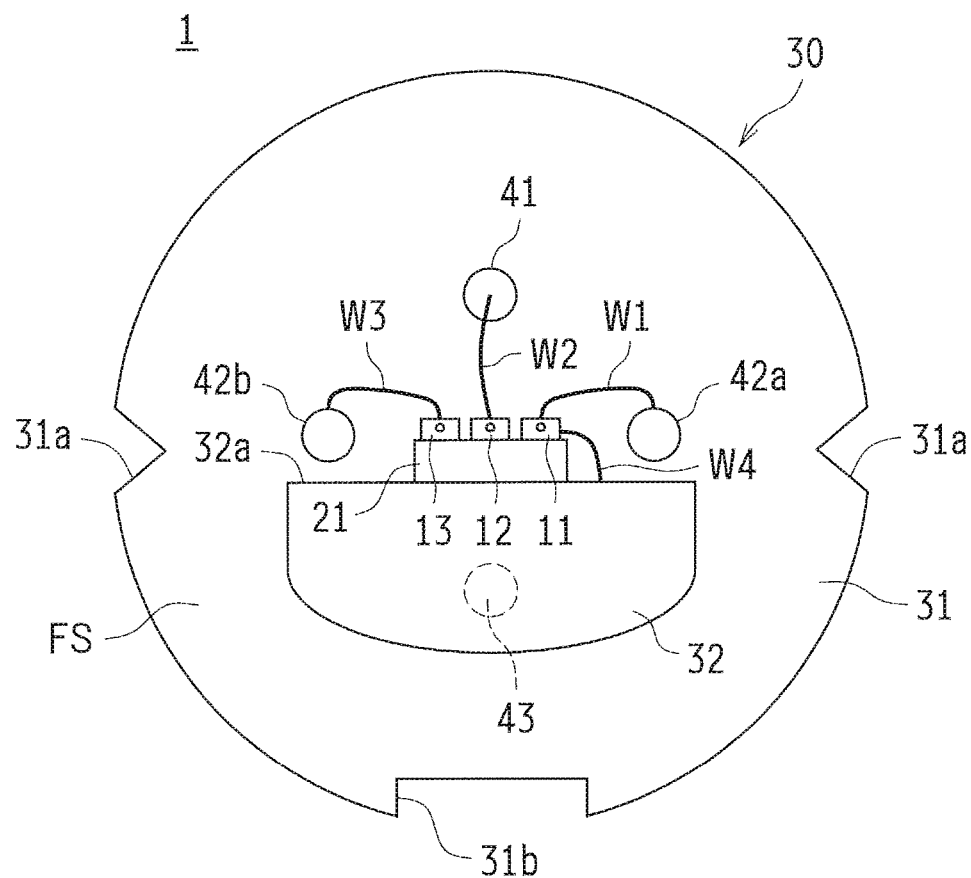
FIG. 2 is a schematic plan view of the laser element illustrated in FIG. 1.

FIG. 1 is a schematic perspective view illustrating a state of the laser element according to the first embodiment of the invention before being sealed by a cap, and FIG. 2 is a schematic plan view of the laser element illustrated in FIG. 1.

The laser element (first laser element 1) according to the first embodiment of the invention includes a light emitting portion and a terminal member 30 (stem) on which the light emitting portion is mounted. In the first laser element 1, the light emitting portion includes three laser chips (a first laser chip 11, a second laser chip 12, and a third laser chip 13) and is attached to the terminal member 30 via one sub-mount (first sub-mount 21).

The first laser chip 11 is a red laser chip that has an oscillation wavelength of 640 nm and one light emitting point. The second laser chip 12 is a blue laser chip that has an oscillation wavelength of 450 nm and one light emitting point. The third laser chip 13 is a green laser chip that has an oscillation wavelength of 520 nm and one light emitting point. The first laser chip 11, the second laser chip 12, and the third laser chip 13 are mounted on the first sub-mount 21 by junction down.

The terminal member 30 is mainly constituted by a base portion 32, a base 31 (eyelet), and four pins. Specifically, the base 31 has a substantially circular shape as viewed from a front surface FS side and has an outer periphery where two V-shaped grooves 31a and a rectangular groove 31b that are used for positioning are provided. The two V-shaped grooves 31a are provided at positions (at a left end and a right end in FIG. 2) facing each other with a center of the base 31 therebetween, and the rectangular groove 31b is provided on a circular arc along the outer periphery of the base 31 and at a middle point (lower end in FIG. 2) between the two V-shaped grooves 31a. The two V-shaped grooves 31a and the rectangular groove 31b each serve as a concave part formed so as to cut a part of the base 31. When the laser element is attached to a different member, convex parts provided in the different member are fitted into the two V-shaped grooves 31a and the rectangular groove 31b, and therefore, the laser element is able to be held so as not to move.

The base portion 32 is provided substantially at a center of the front surface FS of the base 31. Specifically, the base portion 32 is at a position slightly closer to the lower end from the center of the base 31 and has a surface (mounting surface 32a) on a center side on which the first sub-mount 21 is mounted.

As illustrated in FIG. 2, the four pins are constituted by a front pin 41 provided at a position facing the mounting surface 32a, a rear pin 43 provided so as to face the front pin 41 at a position where the light emitting portion is interposed therebetween, and two side pins (a first side pin 42a and a second side pin 42b) provided so as to face each other with the light emitting portion therebetween in a direction of a side surface along the mounting surface 32a, as viewed from the front surface FS of the base 31. That is, the light emitting portion is positioned in a range surrounded by the four pins. The four pins extend in a direction (downward direction from a rear surface RS of the base 31 in FIG. 1) away from the rear surface RS. Moreover, the four pins are provided so as to penetrate the base 31 and also protrude from the front surface FS. Here, a length (protrusion length) by which the front pin 41 protrudes from the front surface FS of the base 31 is shorter than those of the other pins. Note that, the rear pin 43 is provided at a position overlapping the base portion 32 and is connected to the base portion 32 at a part protruding from the front surface FS. That is, a part of the base portion 32 corresponds to the rear pin 43 and a length by which the base portion 32 protrudes from the front surface FS of the base 31 is able to be considered as a protrusion length of the rear pin 43. Hereinafter, a direction in which the pins extend are called an extension direction E (refer to FIG. 5 described later) in some cases for description.

Figure 5:
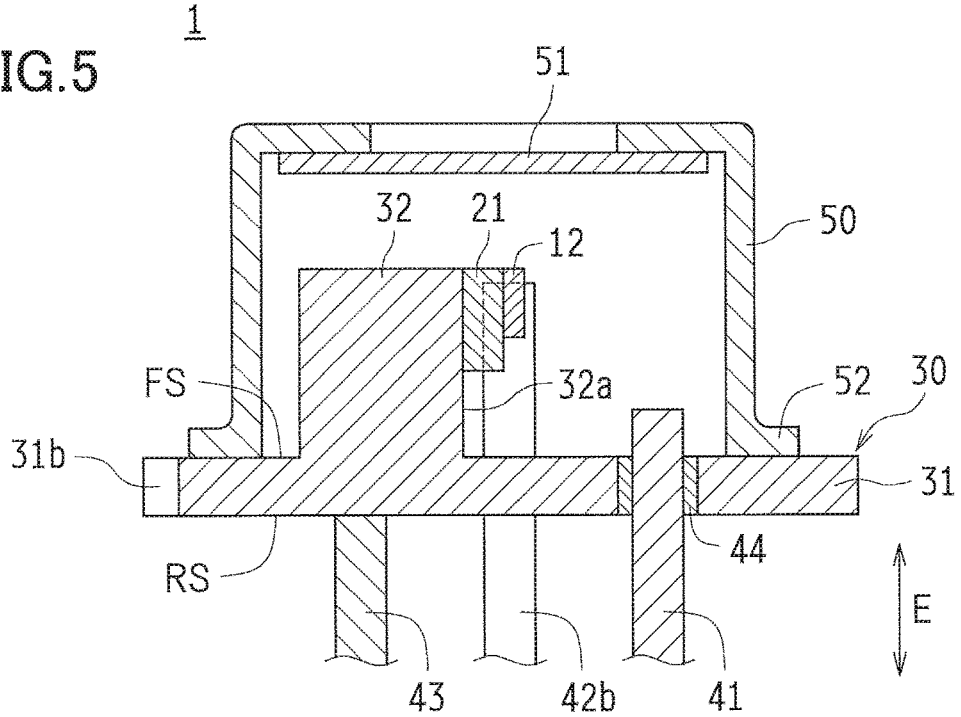
FIG. 5 is a schematic sectional view illustrating a section taken along a line A-A in FIG. 4.

The front pin 41, the first side pin 42a, and the second side pin 42b are each insulated from the base 31 and subjected to hermetic seal to be fixed to the base 31 with an insulating member 44 such as glass therebetween, as illustrated in FIG. 5 described later.

Each of the laser chips is electrically connected to the corresponding pin or the base portion 32 via a wire. Note that, hereinafter, in the laser chip, an exposed surface is called an upper surface and a surface in contact with the sub-mount is called a lower surface in some cases for description. Moreover, when the laser chip is mounted on the sub-mount, an electrode provided on the lower surface of the laser chip is electrically connected to the sub-mount. The first laser chip 11 is electrically connected to the first side pin 42a via a first wire W1 die-bonded to an electrode on the upper surface thereof. The second laser chip 12 is electrically connected to the front pin 41 via a second wire W2 die-bonded to an electrode on the upper surface thereof. The third laser chip 13 is electrically connected to the second side pin 42b via a third wire W3 die-bonded to an electrode on the upper surface thereof. The first sub-mount 21 is electrically connected to the mounting surface 32a (base portion 32) via a fourth wire W4.

In the present embodiment, in the first laser chip 11, the second laser chip 12, and the third laser chip 13, the respective electrodes provided on the upper surfaces are cathode electrodes and the respective electrodes provided on the lower surfaces are anode electrodes, and the respective anode electrodes are anode common elements commonly connected to the mounting surface 32a.

Note that, a configuration of a wire by which a laser chip and a pin are connected is not limited to the aforementioned configuration as long as the laser chips and the pins are connected by the wires in one-to-one correspondence.

Figure 3:
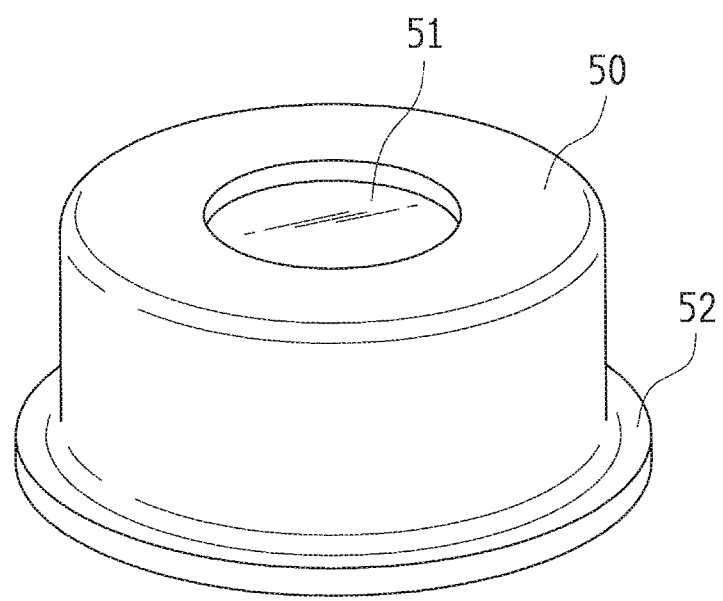
FIG. 3 is a schematic perspective view illustrating the cap attached to a terminal member.

FIG. 3 is a schematic perspective view illustrating a cap attached to the terminal member.

The laser element is hermetically sealed by a cap 50 illustrated in FIG. 3. In the cap 50, an entire bottom surface has a substantially cylindrical shape that is opened and a joint portion 52 having a larger outer diameter is formed in an end on a side of the bottom surface. The joint portion 52 is jointed to the front surface FS of the base 31 described above. An upper surface of the cap 50 is opened at a center and a transparent member 51 (for example, cover glass) is attached so as to cover the opening. In the laser element, the front surface FS of the base 31 is covered with the cap 50 so that the base portion 32 and the four pins are stored in an inner space of the cap 50.

Figure 4:
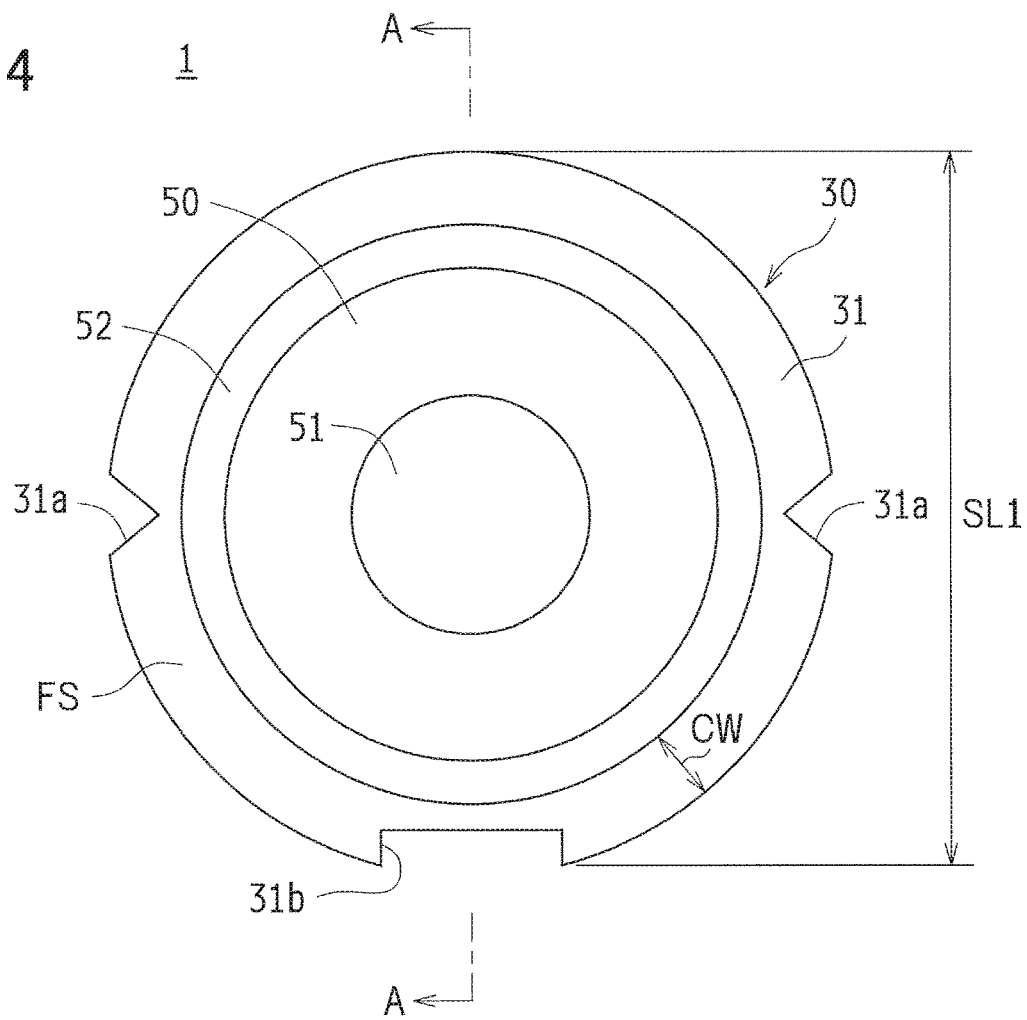
FIG. 4 is a schematic plan view illustrating the laser element sealed by the cap.

FIG. 4 is a schematic plan view illustrating the laser element sealed by the cap, and FIG. 5 is a schematic sectional view illustrating a section taken along a line A-A in FIG. 4. Note that, the wires are omitted in FIG. 5 in consideration of visibility of the figure.

As illustrated in FIG. 4, an outer diameter of the base 31 (peripheral portion) is set to be larger than the outer diameter of the cap 50 (in particular, joint portion 52). Since a difference (distance between outer diameters CW) between the outer diameter of the base 31 and the outer diameter of the cap 50 is provided, a certain degree of a positional shift of the cap 50 relative to the base 31 during sealing is able to be allowed. Note that, a distance between ends facing each other, for example, in a part of the base 31, in which the rectangular groove 31b is provided, is called a first base width SL1 in some cases. In the present embodiment, the outer diameter (φ) of the base 31 (peripheral portion) is set as 3.8 mm.

The laser chips are attached to a tip end (upper end in FIG. 5) of the base portion 32 together with the sub-mount. A position of a tip end of the side pin in the extension direction E is set at the same level as that of corresponding one of the laser chips, and by making the side pin and the laser chip close to each other, a wire provided therebetween is able to be shortened. Further, a tip end of the front pin 41 is positioned closer to the front surface FS than the laser chip in the extension direction E, and a part facing the upper surface of the laser chip is widely opened. This makes it possible to widen a working space for wire bonding to the laser chip.

In a process of assembling the laser element, first, the terminal member 30 is heated to 200° C. Then, the sub-mount on both surfaces of which AuSn solder is disposed is mounted on the mounting surface 32a, and the laser chips are mounted on the sub-mount. Note that, instead of the AuSn solder, silver paste using silver nanoparticles may be applied. Here, since the sub-mount is heated to 200° C. on the base portion 32, the laser chips are temporarily placed on the sub-mount without moving. After that, the terminal member 30 is heated to 320° C. and the solder on both the surfaces of the sub-mount is melted so that the laser chips are fixed onto the sub-mount.

Next, by performing wire-bonding of the laser chips and the sub-mount to the pins and the base portion 32, the state illustrated in FIG. 1 is provided. Then, the terminal member 30 on which the laser chips are mounted and the cap 50 are each baked at 260° C. and the terminal member 30 is covered with the cap 50 in a dry air atmosphere to perform hermetical sealing.

As described above, in the first laser element 1, the first laser chip 11, the second laser chip 12, and the third laser chip 13 are connected to different pins and are thus able to be driven independently. In this manner, the electrical connection via the four pins enables separate control of laser beams emitted from a plurality of light emitting points. Moreover, when the pins are appropriately arranged on the base 31 with the number thereof limited, it is possible to achieve size reduction of the laser element.

Further, when a pin connected to the base 31 and a pin insulated from the base 31 are provided so that different voltages are applied to the pins, the laser element is able to provide a variety of driving.

The rear pin 43 connected to the base 31 is coupled to the base portion 32 on which the laser chips are mounted and has a function of radiating heat generated from the laser chips to outside. Moreover, since the rear pin 43 is directly connected to the base 31, the laser element is able to be firmly fixed when being attached to another member.

As in the present embodiment, a configuration in which two or more laser chips are provided enables separate creation of laser chips, thus making it possible to freely select a material, a structure, and the like.

Second Embodiment

Next, a laser element according to a second embodiment of the invention will be described with reference to the drawing. Note that, a component of the second embodiment having a substantially equal function to that of the first embodiment will be given the same reference sign and description thereof will be omitted.

Figure 6:
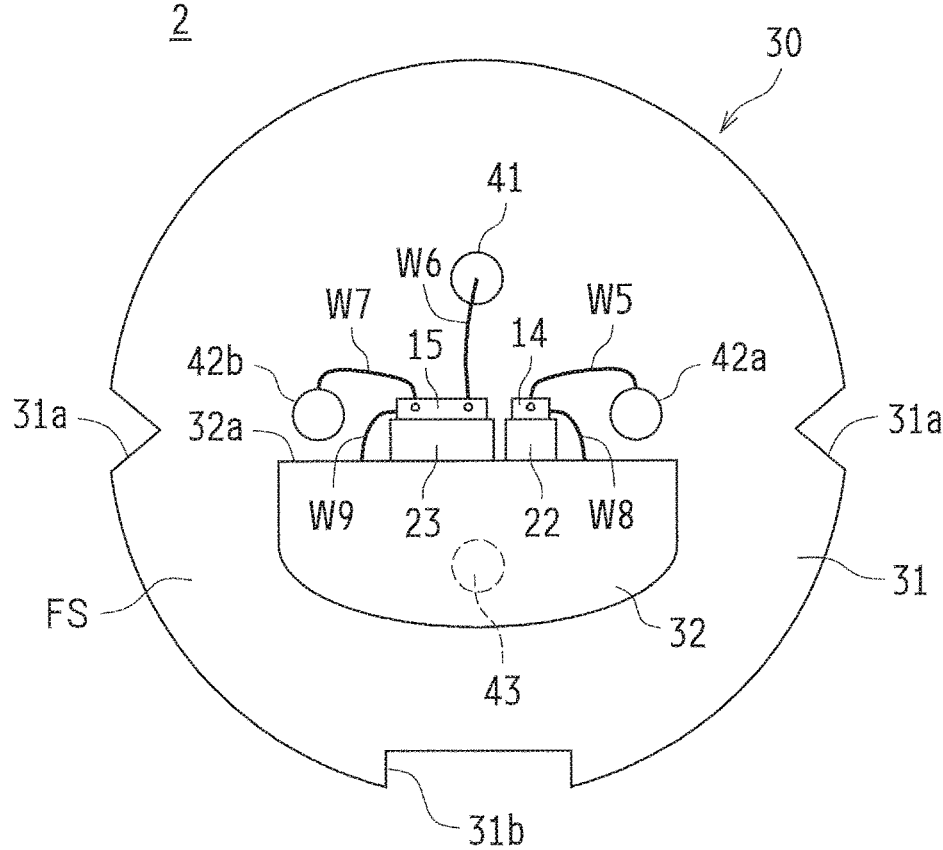
FIG. 6 is a schematic plan view illustrating a state of a laser element according to a second embodiment of the invention before being sealed by the cap.

FIG. 6 is a schematic plan view illustrating a state of the laser element according to the second embodiment of the invention before being sealed by the cap.

The laser element (second laser element 2) according to the second embodiment of the invention is different from that of the first embodiment in a configuration of the light emitting portion. Note that, shapes of the base 31 and the cap 50 are the same as those of the first embodiment, and therefore, description thereof will be omitted.

In the second laser element 2, the light emitting portion includes two laser chips (a fourth laser chip 14 and a fifth laser chip 15) and is attached to the terminal member 30 via two sub-mounts (a second sub-mount 22 and a third sub mount 23).

The fourth laser chip 14 is a blue laser chip that has an oscillation wavelength of 450 nm and one light emitting point. The fifth laser chip 15 is a 2ch-green laser chip that has two light emitting points and oscillation wavelengths of 520 nm and 522 nm. The fourth laser chip 14 is mounted on the second sub-mount 22 by junction up and the fifth laser chip 15 is mounted on the third sub-mount 23 by junction up. In the fifth laser chip 15, two electrodes corresponding to the two light emitting points are provided on an upper surface and one electrode common to the two light emitting points is provided on a lower surface. That is, the second laser element 2 is a cathode common element in which cathode electrodes of the laser chips are commonly connected to the mounting surface 32a.

The fourth laser chip 14 is electrically connected to the first side pin 42a via a fifth wire W5 die-bonded to an electrode on an upper surface thereof. The fifth laser chip 15 is electrically connected to the front pin 41 via a sixth wire W6 die-bonded to one of electrodes provided on the upper surface thereof and is electrically connected to the second side pin 42b via a seventh W7 die-bonded to the other electrode. The second sub-mount 22 is electrically connected to the mounting surface 32a (base portion 32) via an eighth wire W8 and the third sub-mount 23 is electrically connected to the mounting surface 32a (base portion 32) via a ninth wire W9.

According to a configuration in which a laser chip having two or more light emitting points is provided, two types of laser beams are able to be output from one laser chip and a structure is able to be simplified by reducing the number of laser chips. By outputting two laser beams having substantially the same color even though having wavelengths that are different by about several nm, speckle noise is able to be reduced.

In the present embodiment, a wavelength difference in the fifth laser chip 15 is set as 2 nm, but is not limited thereto as long as a configuration having two light emitting points in which the wavelength difference is set as 0.5 nm or more and 5 nm or less is provided.

Third Embodiment

Next, a laser element according to a third embodiment of the invention will be described with reference to the drawings. Note that, a component of the third embodiment having a substantially equal function to those of the first embodiment and the second embodiment will be given the same reference sign and description thereof will be omitted.

Figure 7:
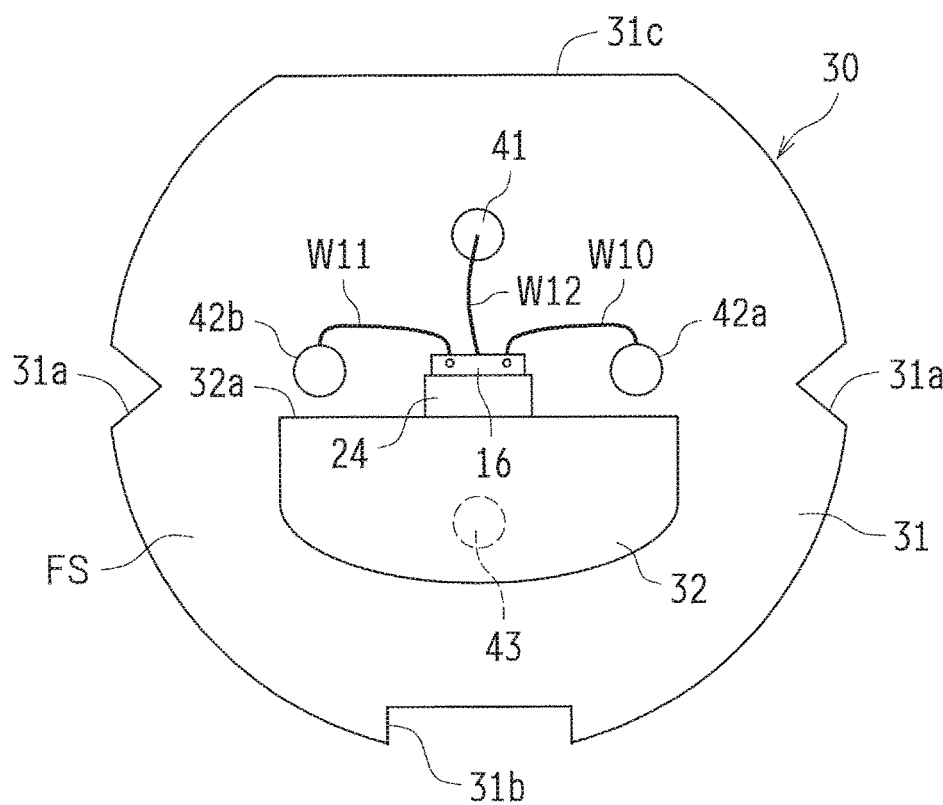
FIG. 7 is a schematic plan view illustrating a state of a laser element according to a third embodiment of the invention before being sealed by the cap.
Figure 8:
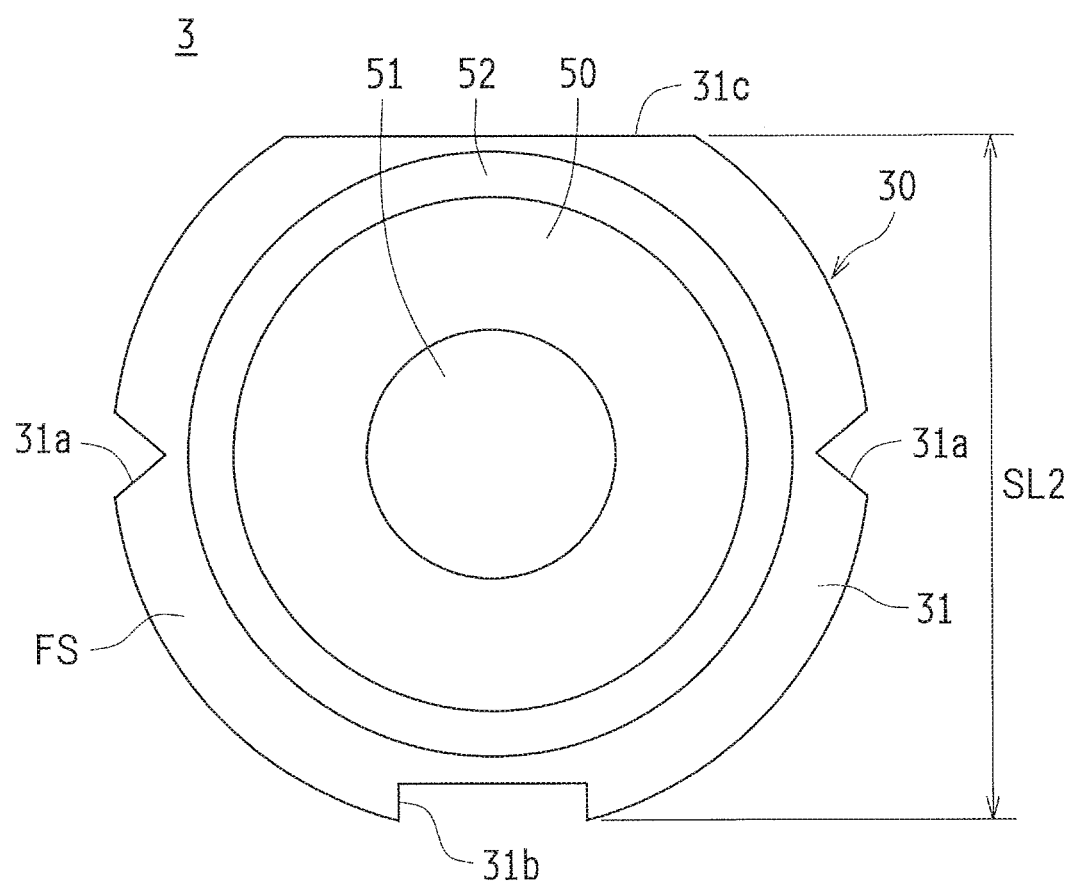
FIG. 8 is a schematic plan view illustrating the laser element sealed by the cap in the third embodiment of the invention.

FIG. 7 is a schematic plan view illustrating a state of the laser element according to the third embodiment of the invention before being sealed by the cap, and FIG. 8 is a schematic plan view illustrating the laser element sealed by the cap in the third embodiment of the invention.

The laser element (third laser element 3) according to the third embodiment of the invention is different from that of the first embodiment in a configuration of the light emitting portion and a shape of the base 31. Note that, the shape of the cap 50 is the same as that in the first embodiment, and therefore, description thereof will be omitted.

In the third laser element 3, the light emitting portion includes one laser chip (sixth laser chip 16) and is attached to the terminal member 30 via one sub-mount (fourth sub-mount 24).

The sixth laser chip 16 is a 2ch-blue laser chip that has two light emitting points and oscillation wavelengths of 450 nm and 455 nm, and is mounted on the fourth sub-mount 24 by junction up. Similarly to the fifth laser chip 15, in the sixth laser chip 16, two electrodes corresponding to the two light emitting points are provided on an upper surface and one electrode common to the two light emitting points is provided on a lower surface.

The sixth laser chip 16 is electrically connected to the first side pin 42a via a tenth wire W10 die-bonded to one of electrodes provided on the upper surface thereof and is electrically connected to the second side pin 42b via an eleventh wire W11 die-bonded to the other electrode. The fourth sub-mount 24 is electrically connected to the front pin 41 via a twelfth wire W12.

Since the front pin 41 and the side pins are electrically insulated from the base 31, the laser chips connected thereto serve as floating wires electrically insulated from the base 31. By using the floating wires, cathode and anode voltages of the laser chips are able to be freely changed by a circuit design while the base 31 is grounded, and therefore, the laser chips have resistance to external noise such as surge.

In the present embodiment, the base 31 has a D-cut shape in which one end is cut as viewed from the front surface FS side and has an outer periphery where a cut portion 31c is provided together with the two V-shaped grooves 31a and the rectangular groove 31b that are described above. The cut portion 31c is provided at a position (upper end in FIG. 7) facing the rectangular groove 31b with the center of the base 31 therebetween and serves as a chord along a direction vertical to a direction in which the cut portion 31c faces the rectangular groove 31b.

Though the outer diameter of the base 31 (peripheral portion) is set as 3.8 mm similarly to the first embodiment, a distance (second base width SL2 illustrated in FIG. 8) between an end of the rectangular groove 31b and an end of the cut portion 31c that face each other becomes shorter than the first base width SL1 described above by providing the cut portion 31c. In this manner, when the cut portion 31c is provided so that the base 31 has the D-cut shape, a width of the laser element is able to be reduced and size reduction of a module that incorporates the laser element is able to be achieved.

Fourth Embodiment

Next, a laser element according to a fourth embodiment of the invention will be described with reference to the drawings. Note that, a component of the fourth embodiment having a substantially equal function to those of the first embodiment through the third embodiment will be given the same reference sign and description thereof will be omitted.

Figure 9:
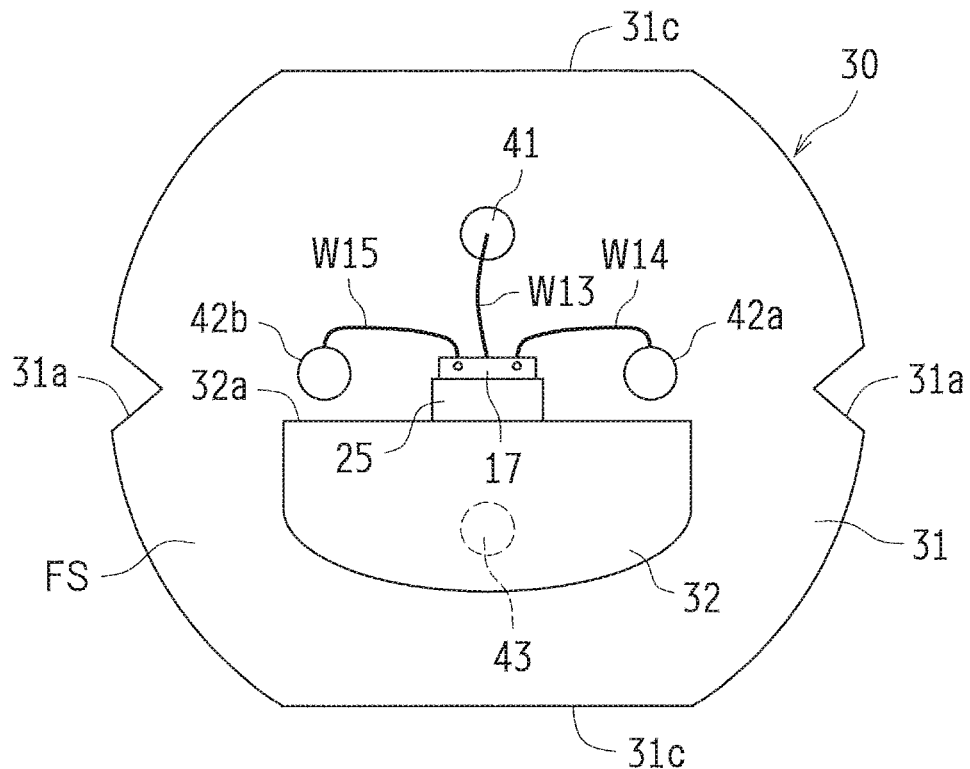
FIG. 9 is a schematic plan view illustrating a state of a laser element according to a fourth embodiment of the invention before being sealed by a cap.
Figure 10:
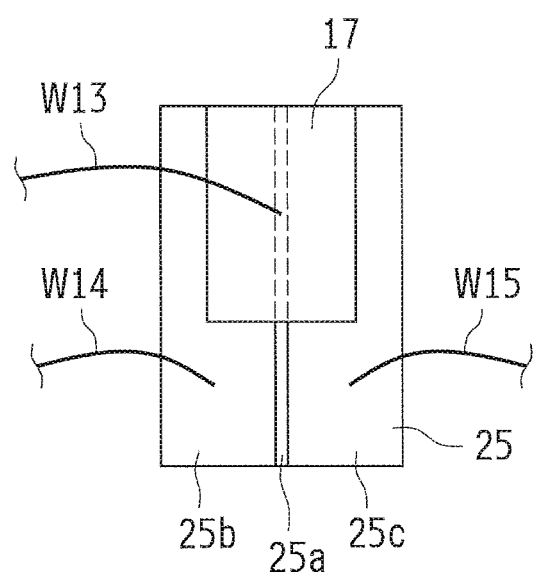
FIG. 10 is a schematic explanatory view illustrating a state of a laser chip as viewed from an upper surface side.
Figure 11:
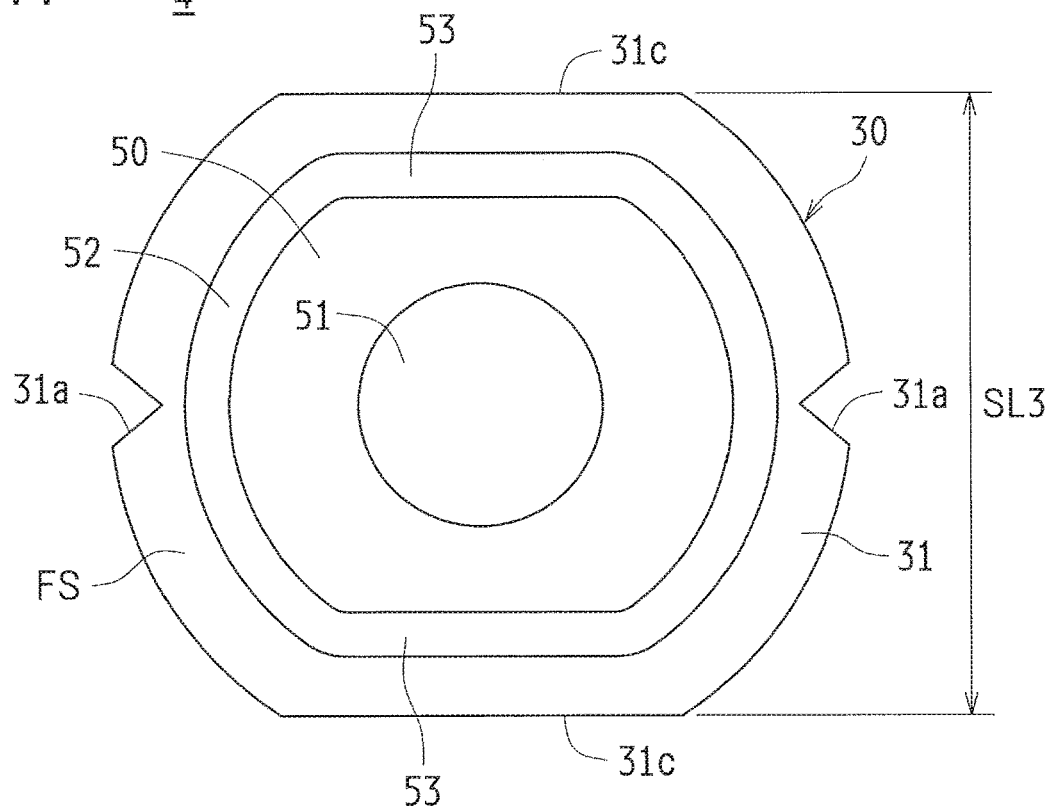
FIG. 11 is a schematic plan view illustrating the laser element sealed by the cap in the fourth embodiment of the invention.

FIG. 9 is a schematic plan view illustrating a state of the laser element according to the fourth embodiment of the invention before being sealed by a cap, FIG. 10 is a schematic explanatory view illustrating a state of a laser chip as viewed from an upper surface side, and FIG. 11 is a schematic plan view illustrating the laser element sealed by the cap in the fourth embodiment of the invention.

The laser element (fourth laser element 4) according to the fourth embodiment of the invention is different from that of the third embodiment in a configuration of the light emitting portion, and shapes of the base 31 and the cap 50.

In the fourth laser element 4, the light emitting portion includes one laser chip (seventh laser chip 17) and is attached to the terminal member 30 via one sub-mount (fifth sub-mount 25).

The seventh laser chip 17 is a 2ch-red laser chip that has two light emitting points and oscillation wavelengths of 635 nm and 635.5 nm, and is mounted on the fifth sub-mount 25 by junction down. In the seventh laser chip 17, in substantially the same manner as the sixth laser chip 16, two electrodes corresponding to the two light emitting points are provided on a lower surface thereof and one electrode common to the two light emitting points is provided on an upper surface thereof.

As illustrated in FIG. 10, on the surface of the fifth sub-mount 25, on which the seventh laser chip 17 is mounted, an electrode division portion 25a with no metallization is provided. Thereby, the surface of the fifth sub-mount 25 has a part electrically insulated and has a conductive part divided into a first contact portion 25b and a second contact portion 25c. The seventh laser chip 17 is arranged on the fifth sub-mount 25 across the first contact portion 25b and the second contact portion 25c, and has the lower surface where one of electrodes contacts the first contact portion 25b and the other electrode contacts the second contact portion 25c.

The seventh laser chip 17 is electrically connected to the front pin 41 via a thirteenth wire W13 die-bonded to the electrode provided on the upper surface thereof. In the fifth sub-mount 25, the first contact portion 25b and the first side pin 42a are electrically connected via a fourteenth wire W14 and the second contact portion 25c and the second side pin 42b are electrically connected via a fifteenth wire W15.

In the present embodiment, the base 31 has, as viewed from the front surface FS side, an I-cut shape in which facing ends are cut and has an outer periphery where two cut portions 31c are provided together with the two V-shaped grooves 31a described above. The two cut portions 31c are provided at positions (an upper end and a lower end in FIG. 9) facing each other with the center of the base 31 therebetween and each serve as a chord along a direction vertical to a direction in which the cut portions 31c face each other. That is, a corresponding one of the cut portion 31c is provided in a part where the rectangular groove 31b is provided in the base 31 illustrated in FIG. 7.

Similarly to the base 31, the cap 50 also has such a shape that is obtained by cutting two parts of a peripheral surface thereof. As illustrated in FIG. 11, flat surface portions 53 are provided at two parts facing each other with a center of a circle therebetween in the peripheral surface of the cap 50. When the base 31 is covered with the cap 50, the cap 50 may be arranged so that the flat surface portions 53 are provided along the cut portions 31c. On parts outer diameters of which are reduced because of providing the cut portions 31c, the flat surface portions 53 by which an outer diameter of the cap 50 is reduced in the same manner are set, thus making it possible to enable the cap 50 to be fit on the base 31.

Though the outer diameter of the base 31 (peripheral portion) is set as 3.8 mm similarly to the first embodiment, a distance (third base width SL3 illustrated in FIG. 11) between the cut portions 31c becomes shorter than the first base width SL1 and the second base width SL2 described above by providing the two cut portions 31c. In this manner, when the cut portions 31c are provided so that the base 31 has the I-cut shape, a width of the laser element is able to be further reduced.

Note that, the shape of the cap 50 is not limited thereto and may be a D-cut shape in which one flat surface portion 53 is provided. Moreover, also to the cap 50 used in the first embodiment through the third embodiment, the cap 50 whose width is reduced may be applied similarly to the fourth embodiment.

Fifth Embodiment

Next, a laser element according to a fifth embodiment of the invention will be described with reference to the drawings. Note that, a component of the fifth embodiment having a substantially equal function to those of the first embodiment through the fourth embodiment will be given the same reference sign and description thereof will be omitted.

Figure 12:
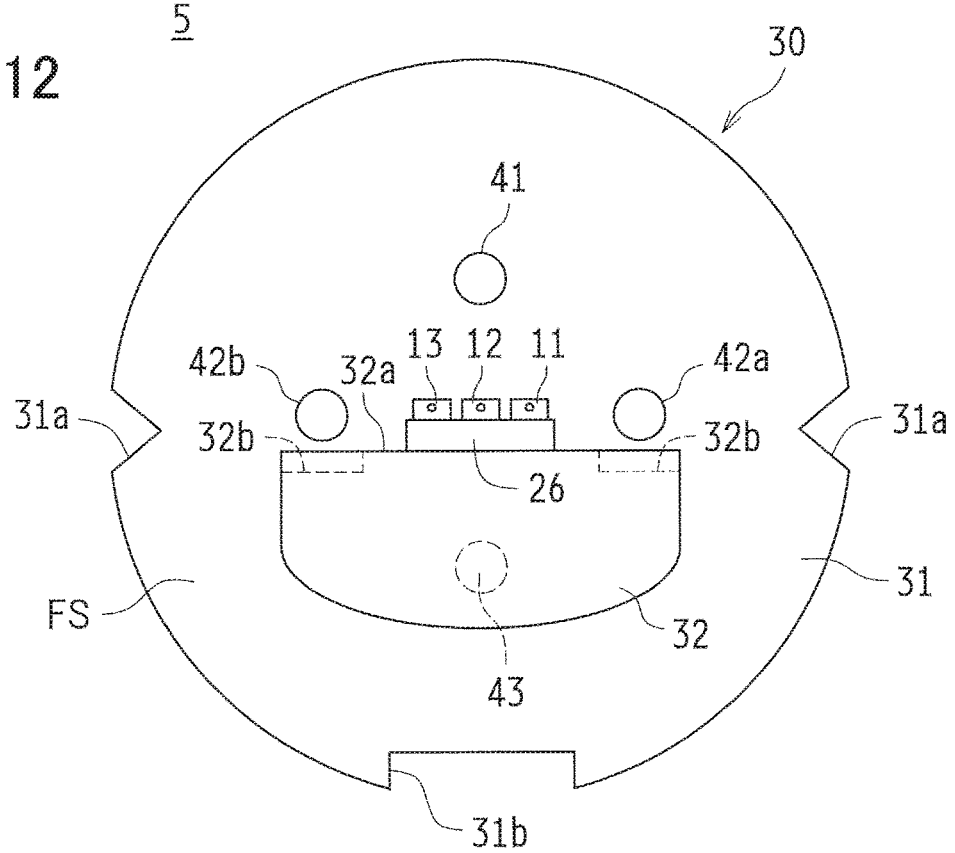
FIG. 12 is a schematic plan view illustrating a state of a laser element according to a fifth embodiment of the invention before being sealed by the cap.
Figure 13:
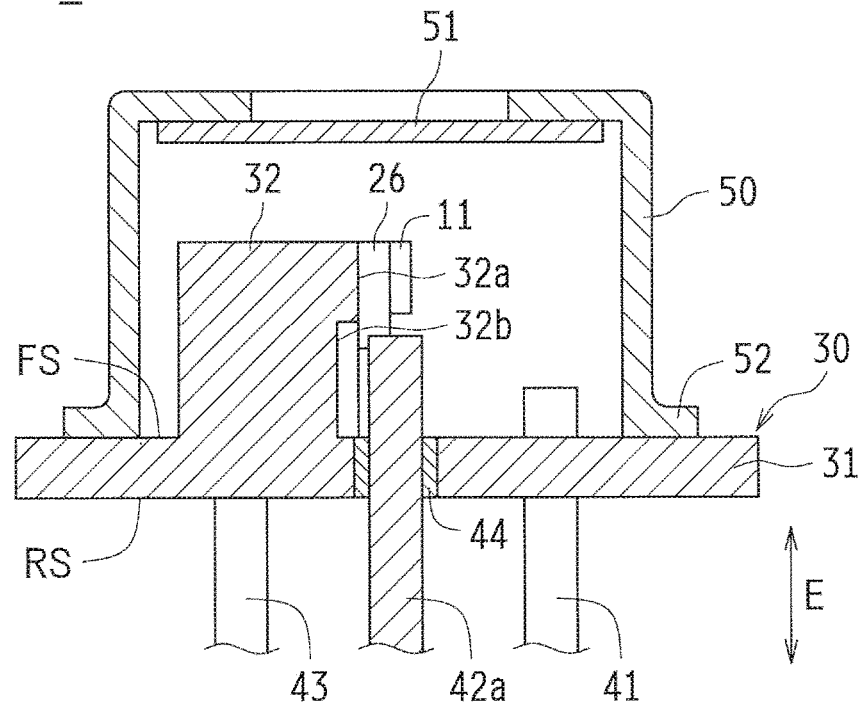
FIG. 13 is a schematic sectional view schematically illustrating a section of the laser element illustrated in FIG. 12 in a vicinity of side pins.

FIG. 12 is a schematic plan view illustrating a state of the laser element according to the fifth embodiment of the invention before being sealed by the cap, and FIG. 13 is a schematic sectional view schematically illustrating a section of the laser element illustrated in FIG. 12 in a vicinity of side pins. Note that, wires are omitted in FIGS. 12 and 13 in consideration of visibility of the figure.

The laser element (fifth laser element 5) according to the fifth embodiment of the invention is different from that of the first embodiment in a shape of the base 31 (in particular, base portion 32).

The base portion 32 includes eaves portions 32b obtained by cutting ends in a direction of a side surface along the mounting surface 32a, and the side pins (the first side pin 42a and the second side pin 42b) are provided at positions facing the eaves portions 32b. The base portion 32 has a larger size so that the mounting surface 32a is closer to the side pins as compared to the first embodiment or the like. In arrangement of the pins in the present embodiment, when the size of the base portion 32 is increased, there is concern about interference with the side pins. Thus, by providing the eaves portions 32b near the side pins, capacity (volume) of the base portion 32 is increased while ensuring a gap between the base portion 32 and the side pins, thus making it possible to enhance a heat radiation effect.

A light emitting portion of the fifth laser element 5 has a configuration substantially similar to that of the first laser element 1 and is configured such that three laser chips (the first laser chip 11, the second laser chip 12, and the third laser chip 13) are mounted on one sub-mount (sixth sub-mount 26). The sixth sub-mount 26 is reduced in a thickness as compared to that of the first sub-mount 21 by an amount of the increase in the size of the base portion 32, and therefore, the laser chips are able to be set at the position relative to the base 31 the same as that in the first laser element 1. Note that, wires connecting the pins and the laser chips may be provided in the same manner as those in the first laser element 1.

Figure 14:
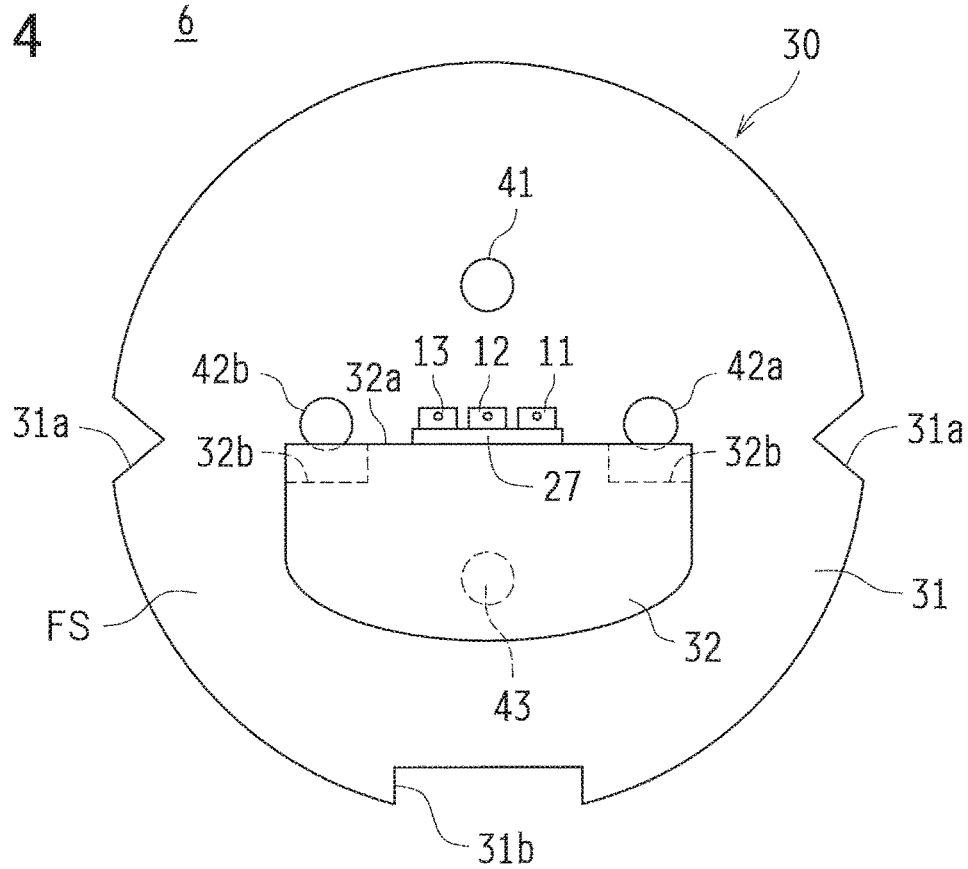
FIG. 14 is a schematic plan view illustrating a state of a laser element according to a modified example of the fifth embodiment of the invention before being sealed by the cap.
Figure 15:
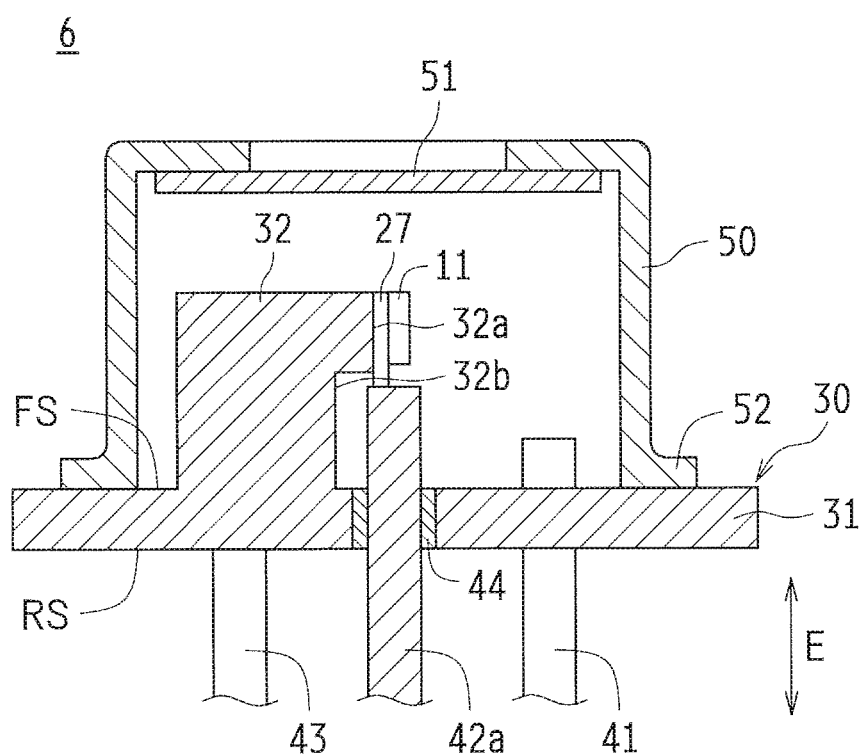
FIG. 15 is a schematic sectional view schematically illustrating a section of the laser element illustrated in FIG. 14 in a vicinity of side pins.

FIG. 14 is a schematic plan view illustrating a state of a laser element according to a modified example of the fifth embodiment of the invention before being sealed by the cap, and FIG. 15 is a schematic sectional view schematically illustrating a section of the laser element illustrated in FIG. 14 in a vicinity of side pins. Note that, wires are omitted in FIGS. 14 and 15 in consideration of visibility of the figures.

The laser element (sixth laser element 6) in the modified example is different from the fifth laser element 5 in a positional relationship between the base portion 32 and the side pins. Specifically, in the modified example, the base portion 32 is positioned still closer to the side pins and the mounting surface 32a is overlapped with the side pins as viewed from the front surface FS of the base 31. The eaves portions 32b are increased in a size so that the side pins and the base portion 32 do not contact with each other. In this manner, by increasing the capacity (volume) of the base portion 32, the heat radiation effect is able to be further enhanced.

Positions of the laser chips may be adjusted by using a seventh sub-mount 27 that is reduced in a thickness as compared to that of the sixth sub-mount 26. The eaves portions 32b may have such a size that allows the sides pins to be substantially covered, and by reducing the size as much as possible, the capacity of the base portion 32 is able to be increased.

The invention is not limited to the configurations described above and structures of the first embodiment through the fifth embodiment may be partially extracted and appropriately combined. That is, in a laser element, the number of laser chips or an oscillation wavelength thereof may be changed or a shape of the base 31 or the cap 50 may be changed.

Note that, the embodiments disclosed herein are an example in all respects and shall not serve as a basis for limited interpretation. Accordingly, the technical scope of the invention shall not be interpreted only by the aforementioned embodiments, but is defined on the basis of the description of the claims. Moreover, meanings equivalent to the claims and all modification falling in the scope of the claims are included.

What is claimed is:

1. A laser element comprising:
a light emitting portion that has at least two or more light emitting points; and
a terminal member on which the light emitting portion is mounted, wherein
the terminal member includes:
a base portion that has a mounting surface on which the light emitting portion is mounted,
a base that has a front surface where the base portion is provided substantially at a center, and
four pins that extend from a rear surface of the base,
the light emitting portion is positioned in a range surrounded by the four pins as viewed from the front surface of the base,
the four pins are constituted by a front pin, a rear pin, and two side pins,
the base is electrically connected to the rear pin and is insulated from the front pin and the side pins,
the light emitting portion includes: a first light emitting point and a second light emitting point; a first electrode corresponding to the first light emitting point; a second electrode corresponding to the second light emitting point; and a common electrode in common between the first light emitting point and the second light emitting point, and
the first electrode, the second electrode, and the common electrode are each electrically connected to a different one of the front pin and the two side pins.

2. The laser element according to claim 1, wherein
the four pins are constituted by the front pin provided at a position facing the mounting surface, the rear pin provided so as to face the front pin at a position where the light emitting portion is interposed therebetween, and the two side pins provided so as to face each other with the light emitting portion therebetween in a direction of a side surface along the mounting surface, as viewed from the front surface of the base, and
a length by which the front pin protrudes from the front surface of the base is shorter than lengths of the other pins.

3. The laser element according to claim 2, wherein
the base portion includes eaves portions obtained by cutting ends in the direction of the side surface, and
the side pins are provided at positions facing the eaves portions.

4. The laser element according to claim 1, wherein
the base has a circular shape as viewed from a side of the front surface.

5. The laser element according to claim 1, wherein
the base has a D-cut shape in which one end is cut as viewed from a side of the front surface.

6. The laser element according to claim 1, wherein
the base has an I-cut shape in which ends facing each other are cut as viewed from a side of the front surface.

7. The laser element according to claim 1, wherein
the light emitting portion includes at least two or more laser chips.

8. The laser element according to claim 1, wherein
the light emitting portion includes a laser chip having at least two or more light emitting points.

9. The laser element according to claim 1, wherein
the light emitting portion has two light emitting points that output laser beams whose wavelength difference is 0.5 nm or more and 5 nm or less.

10. The laser element according to claim 1, wherein
the light emitting portion is electrically insulated from the base.

11. The laser element according to claim 8, further comprising
a sub-mount on which the laser chip is mounted, the sub-mount being mounted on the mounting surface, wherein
the sub-mount includes a first contact portion and a second contact portion, which are electrically insulated by an electrode division portion,
the first electrode is electrically connected to one of the two side pins via the first contact portion,
the second electrode is electrically connected to another one of the two side pins via the second contact portion, and
the common electrode is electrically connected to the front pin.

12. A laser element comprising:
a light emitting portion that has at least two or more light emitting points; and
a terminal member on which the light emitting portion is mounted, wherein
the terminal member includes:
a base portion that has a mounting surface on which the light emitting portion is mounted,
a base that has a front surface where the base portion is provided substantially at a center, and
four pins that extend from a rear surface of the base,
the light emitting portion is positioned in a range surrounded by the four pins as viewed from the front surface of the base,
the four pins are constituted by a front pin provided at a position facing the mounting surface, a rear pin provided so as to face the front pin at a position where the light emitting portion is interposed therebetween, and two side pins provided so as to face each other with the light emitting portion therebetween in a direction of a side surface along the mounting surface, as viewed from the front surface of the base,
the base portion includes eaves portions obtained by cutting ends in the direction of the side surface, and
the two side pins are positioned to at least partially overlap the eaves portions as viewed from the front surface of the base.

* * * * *